(12) United States Patent
Park (10) Patent No.: US 6,589,813 B1
(45) Date of Patent: Jul. 8, 2003

(54) CHIP SIZE STACK PACKAGE AND METHOD OF FABRICATING THE SAME

(75) Inventor: Sang Wook Park, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/604,089

(22) Filed: Jun. 27, 2000

(30) Foreign Application Priority Data

Jun. 28, 1999 (KR) .............................. 99-24627

(51) Int. Cl.[7] .................... H01L 21/44; H01L 21/48
(52) U.S. Cl. .................... 438/109; 438/107; 438/617
(58) Field of Search ................... 257/684–686, 257/691–694, 690, 777, 784, 723, 676; 438/108–109, 118–119, 113, 617, 107, 110, 123

(56) References Cited

U.S. PATENT DOCUMENTS

| | | | |
|---|---|---|---|
| 4,996,583 A | | 2/1991 | Hatada ..................... 357/70 |
| 5,526,230 A | | 6/1996 | Val ........................... 361/704 |
| 6,002,177 A | | 12/1999 | Gaynes et al. ............. 257/774 |
| 6,133,627 A | * | 10/2000 | Khandros et al. |
| 6,307,256 B1 | * | 10/2001 | Chiang et al. |
| 6,184,064 B1 | * | 2/2002 | Jiang et al. |
| 6,190,947 B1 | * | 2/2002 | Tai et al. |
| 6,350,668 B1 | * | 2/2002 | Chakravorty |

FOREIGN PATENT DOCUMENTS

| | | |
|---|---|---|
| JP | 07-130949 | 5/1995 |
| JP | 08236694 | 9/1996 |

* cited by examiner

*Primary Examiner*—Wael Fahmy
*Assistant Examiner*—Dilinh Nguyen
(74) *Attorney, Agent, or Firm*—Pillsbury Winthrop LLP

(57) ABSTRACT

Disclosed are a chip size stack package and a method of fabricating the same. Two semiconductor chips are arranged such that their bond pads-forming surfaces are opposed to each other. Insulating layers are applied to the bond pads-forming surfaces of the semiconductor chips, and via-holes for exposing bond pads are formed in the insulating layers. Metal traces which are exposed at both sides of the insulating layers are formed on the via-holes, whereby the insulating layers are bonded to each other and the metal traces are also bonded to each other. One ends of metal wires are connected to the metal traces which are exposed at the insulating layers, and both sides of the semiconductor chips are molded by an encapsulate such that the other ends of the metal wires are exposed. Instead of the metal wires, pattern tapes can be used. One ends of the pattern tapes are electrically connected to the metal traces when the insulating layers are bonded to each other, and the other ends of the pattern tapes are exposed. In this case, a space between the staked semiconductor chips is also molded. In place of the encapsulate, an anisotrophic conductive adhesive can be intervened between the semiconductor chips. A heat sink can be attached to a surface of the upper semiconductor chip.

7 Claims, 11 Drawing Sheets

CHIP SIZE STACK PACKAGE AND METHOD OF FABRICATING THE SAME

BACKGROUND OF THE INVENTION

1. Field of the Invention

The present invention relates to a chip size stack package and a method of fabricating the chip size stack package, and more particularly, the present invention relates to a stack package in which at least two semiconductor chips are stacked to accomplish a size substantially corresponding to that of the conventional semiconductor chip, and a method of fabricating the chip size stack package.

2. Description of the Related Art

Nowadays, the increase in a capacity of a memory chip is undergoing rapid progress. In this regard, while a 128M DRAM is currently produced in large quantities, a 256M DRAM will instead be mass-produced in the near future.

As a method for increasing a capacity of a memory chip, i.e., for rendering a high integration rate, a technique of inserting more cells into a preset area of a semiconductor device, is disclosed in the art. However, it takes a lengthy period of time to develop such technique, and the technique requires a high precision with respect to forming a line width, etc. To cope with these problems, recently, a stacking technique which enables a high integration rate to be realized in a simpler manner, has been vigorously developed.

The term, "stacking" which is used in the semiconductor industry, means a method of doubling a capacity of a memory chip by heaping up at least two semiconductor chips in a vertical direction. By the stacking technique, for instance, a 128M DRAM device can be constituted by two 64M DRAM devices and a 256M DRAM device can be constituted by two 128M DRAM devices.

In a typical example of stack packages which are produced using the stacking technique, inner leads of a lead frame are attached, using an adhesive, to a semiconductor chip on an upper surface of which bond pads are located. The inner leads are connected to the bond pads through metal wires. The entire structure is molded by an encapsulate in a manner such that outer leads of the lead frame are exposed at sides of the semiconductor chip.

On the package constructed as just mentioned above, there is stacked another package having the same construction. In other words, outer leads of the upward positioned package are coupled to a middle portion of the lead frame of the downward positioned package, whereby an electrical connection between two packages is effected.

However, the stack package according to the conventional art suffers from defects in that a thickness of the entire stack package is increased. Moreover, since a signal must be transmitted from the outer leads of the upper package through the lead frame of the lower package, a signal transmitting path is overly lengthened. Furthermore, due to the fact that the leads of the upper and lower packages are coupled to each other by means of soldering, an inferior connection may result from an improper soldering.

Figure 1:
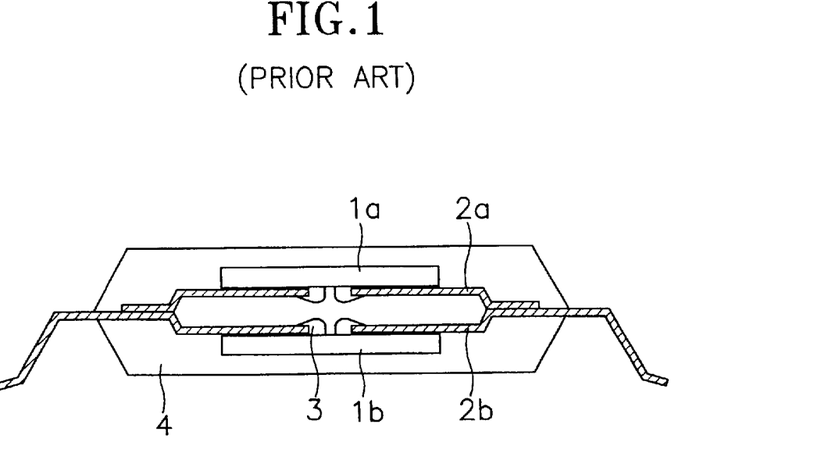
FIG. 1 is a cross-sectional view illustrating the conventional stack package.

To solve these defects, another conventional stack package as shown in FIG. 1 is disclosed in the art. As shown in FIG. 1, upper and lower semiconductor chips 1a and 1b having surfaces on which bond pads are formed, are arranged in a manner such that the surfaces thereof are opposed to each other at a predetermined interval. Upper and lower lead frames 2a and 2b are bonded to the respective surfaces of the upper and lower semiconductor chips 1a and 1b on which surfaces the bond pads are formed, and inner leads of the upper and lower lead frames 2a and 2b are electrically connected to the bond pads by metal wires 3. On the other hand, an outer end of the upper lead frame 2a is bonded to a middle portion of the lower lead frame 2b. The resultant structure is molded by an encapsulate 4 in a manner such that only outer leads of the lower lead frame 2b are exposed.

Nevertheless, the conventional stack package as shown in FIG. 1 still encounters drawbacks as described below.

First, while a signal transmitting path is shortened, if a flaw is caused in one semiconductor chip, two semiconductor chips should be discarded together.

Moreover, by the fact that the respective lead frames are located in such a way as to be opposed to each other, a defective proportion can be increased due to a tolerance between the two lead frames. Also, because the two lead frames are joined to each other using a laser, costly laser equipment is needed. Particularly, since the lead frames are semi-permanently joined to each other, a repairing operation afterwards may be impossible. Further, in the case that a size of a memory chip varies, a lead frame must be newly manufactured.

In addition, because the respective semiconductor chips are completely molded by the encapsulate, heat dissipation cannot be effectively executed while the upper and lower semiconductor chips are driven. That is to say, since a heat sink cannot be adequately installed, heat dissipation cannot be implemented in a sufficient degree.

SUMMARY OF THE INVENTION

Accordingly, the present invention has been made in an effort to solve the problems occurring in the related art, and an object of the present invention is to provide a chip size stack package which prevents signal interference from being generated and shortens a signal transmitting path, while not increasing an entire thickness, and a method of fabricating the chip size stack package.

Another object of the present invention is to provide a chip size stack package in which an electrical signal connection between stacked semiconductor chips is realized through a simple process without using costly laser equipment, and a method of fabricating the chip size stack package.

Still another object of the present invention is to provide a chip size stack package in which respective semiconductor chips are coupled with each other in such a way as to be capable of being easily detached from each other, whereby it is possible to prevent the chip size stack package from being discarded as a whole when a flaw is induced in one semiconductor chip, and a method of fabricating the chip size stack package.

Yet still another object of the present invention is to provide a chip size stack package which enables a heat sink to be attached to a board, whereby a heat dissipation characteristic is improved, and a method of fabricating the chip size stack package.

In order to achieve the above objects, a chip size stack package according to the present invention is constructed as described below.

Two semiconductor chips are arranged in a manner such that their bond pads-forming surfaces are opposed to each other. Insulating layers are applied to the bond pads-forming surfaces of the semiconductor chips, and via-holes for exposing bond pads are formed in the insulating layers.

Metal traces which are exposed at both sides of the insulating layers are formed on the via-holes, whereby the insulating layers are bonded to each other and the metal traces are also bonded to each other. One ends of metal wires are connected to the metal traces which are exposed at the insulating layers, and both sides of the semiconductor chips are molded by an encapsulate in a manner such that the other ends of the metal wires are exposed.

On the other hand, instead of the metal wires, pattern tapes can be used. One ends of the pattern tapes are electrically connected to the metal traces at the same time when the insulating layers are bonded to each other, and the other ends of the pattern tapes are exposed. In this case, a space between the staked semiconductor chips is also molded. In place of the encapsulate, an anisotrophic conductive adhesive (ACA) can be intervened between the semiconductor chips. In the above-described three structures, it is preferred that a heat sink be attached to a surface of the upper semiconductor chip.

The chip size stack package constructed as mentioned above is fabricated as stated below.

After an insulating layer is applied to a surface of a wafer which has a plurality of semiconductor chips, by etching the insulating layer, bond pads of each semiconductor chip are exposed. Metal traces which are connected to bond pads, are formed on the insulating layer. Then, by cutting the wafer along a scribe line, the wafer is divided into respective semiconductor chips. Thereafter, insulating layers of two semiconductor chips are thermally compressed, whereby the respective metal trace layers are electrically connected with each other. After one ends of outside connection terminals are electrically connected to the metal traces, both sides of the respective semiconductor chips are molded by an encapsulate in a manner such that only the other ends of the outside connection terminals are exposed.

In the case that the outside connection terminals comprise metal wires, first, in a state wherein respective insulating layers are bonded to each other, one ends of the metal wires are bonded to portions of the metal traces which portions are exposed at sides of the insulating layers. In the case that the outside connection terminals comprise pattern tapes, one ends of the pattern tapes are bonded using an adhesive between the metal traces, a space between the respective semiconductor chips and both sides of the semiconductor chips are molded using an encapsulate. Before performing the molding process, an ACA can be intervened between the respective semiconductor chips. On the other hand, a heat sink can be attached to a surface of the upper semiconductor chip.

By the features of the present invention, since metal traces are used instead of lead frames, signal interference is minimized. Due to the fact that the lead frames are not used, costly laser equipment for joining the lead frames are not needed. Moreover, by the fact that an encapsulate molds only sides of the stacked semiconductor chips, by removing the encapsulate at the sides of the stacked semiconductor chips, the stack semiconductor chips can be easily detached from each other. Further, as a surface of each semiconductor chip is exposed, it is possible to attach a heat sink to the surface.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Reference will now be made in greater detail to a preferred embodiment of the invention, an example of which is illustrated in the accompanying drawings. Wherever possible, the same reference numerals will be used throughout the drawings and the description to refer to the same or like parts.

Embodiment 1

FIGS. 2 through 22 are views illustrating, in regular sequence, fabricating processes of a chip size stack package in accordance with a first embodiment of the present invention.

Figure 2:
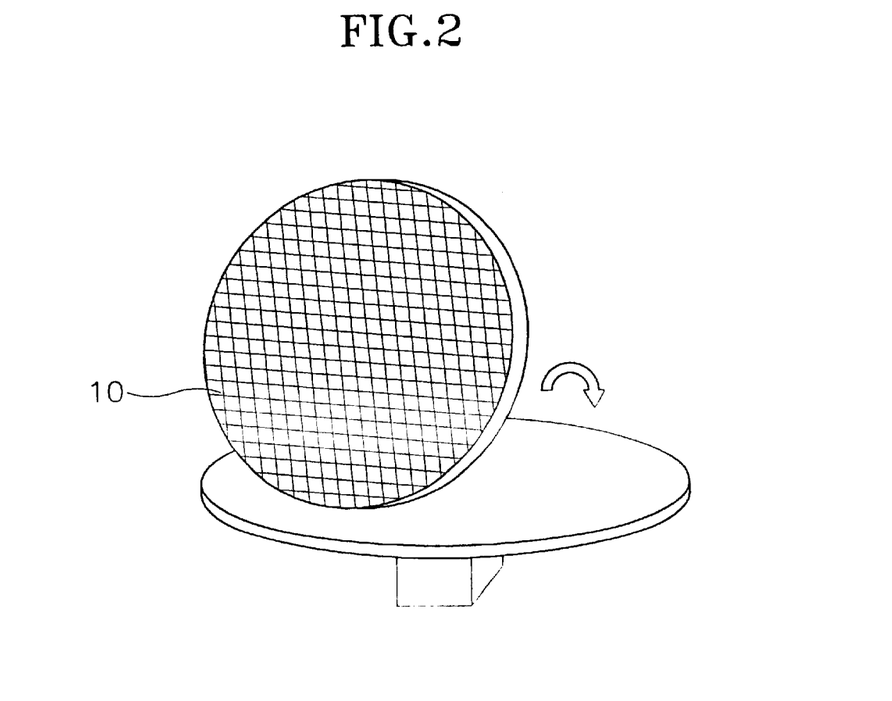
FIGS. 2 through 22 are views illustrating, in regular sequence, fabricating processes of a chip size stack package in accordance with a first embodiment of the present invention.
Figure 3:
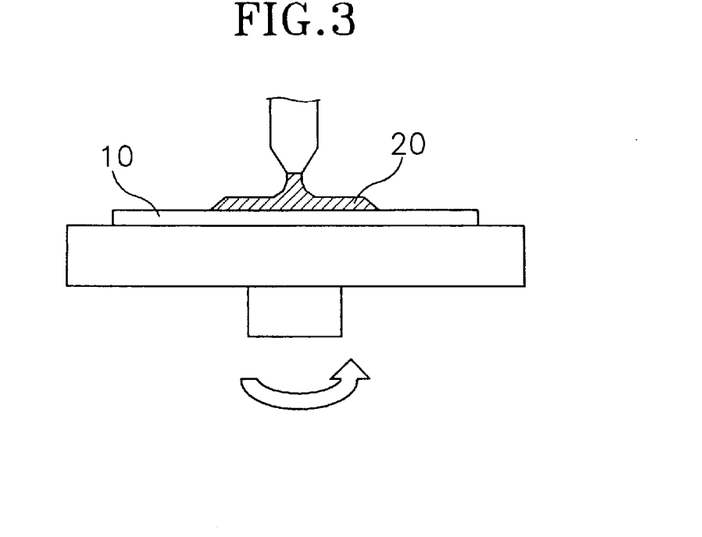
Figure 4:
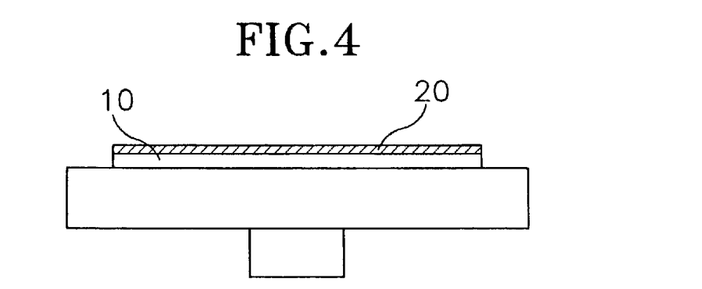

First, as shown in FIG. 2, a wafer 10 having a plurality of semiconductor chips is put on a rotating table. Then, as shown in FIG. 3, by spin-coating an insulating material on the wafer 10 while rotating the table, an insulating layer 20 having a predetermined thickness is applied onto a surface of the wafer 10 as shown in FIG. 4.

Figure 5:
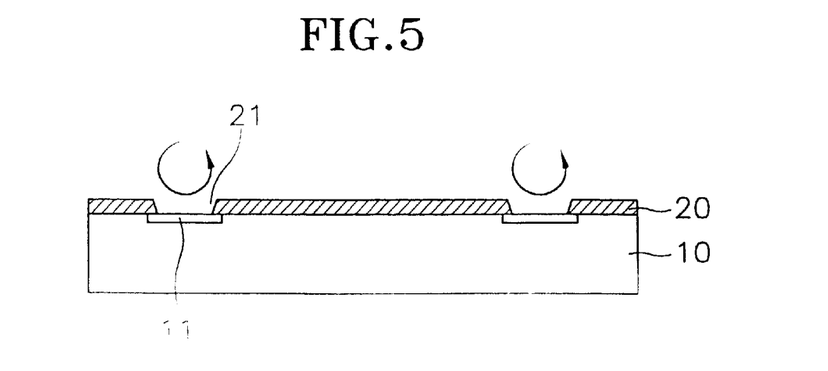
Figure 6:
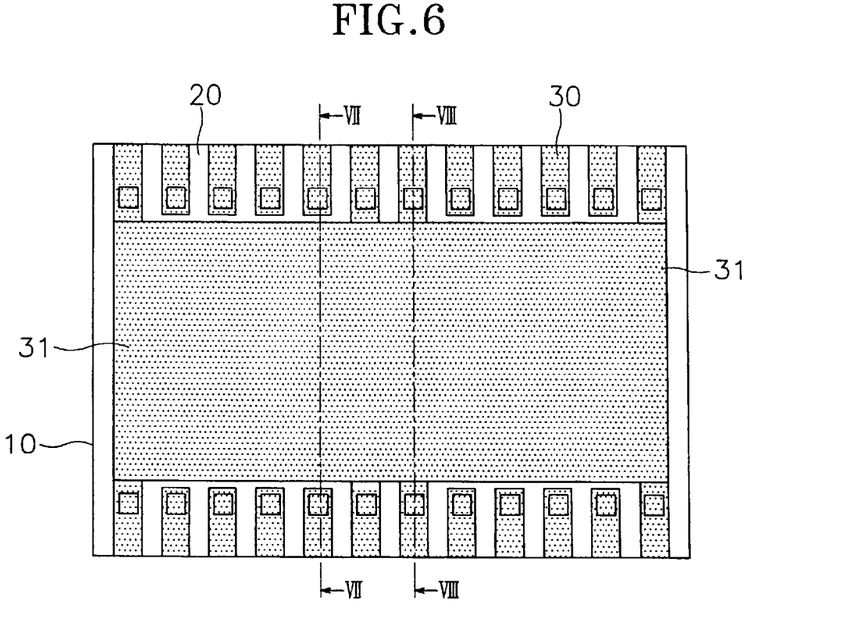
Figure 7:
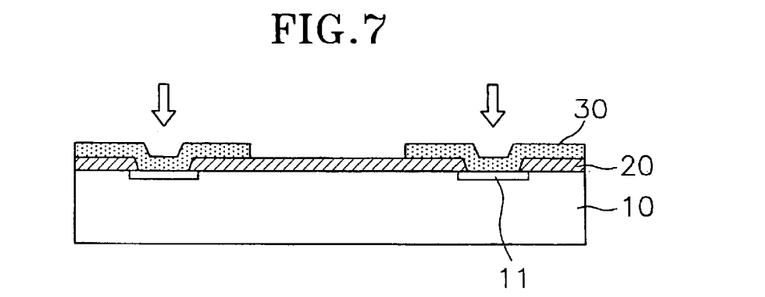
Figure 8:
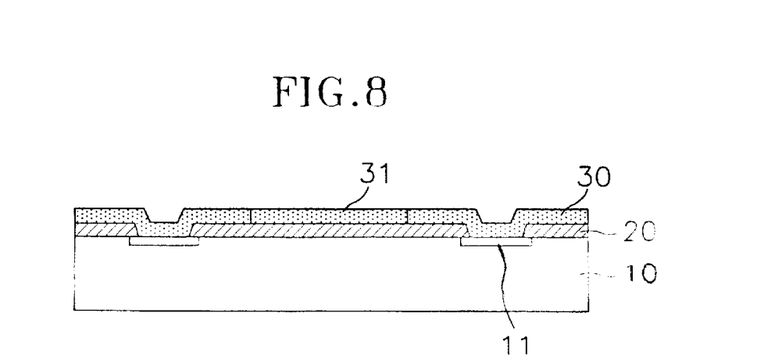

Thereafter, as shown in FIG. 5, by etching the insulating layer 20, via-holes 21 which expose bond pads 11, are formed. Then, after a metal layer is deposited on the insulating layer 20, by patterning the metal layer, metal traces 30 are formed. FIG. 6 is a plan view illustrating a structure of the metal traces 30. In FIG. 6, the metal traces 30 are connected to the bond pads 11, respectively. At this time, in a center part of the insulating layer 20, a portion 31 of the metal layer is not removed but left. The portion 31 of the metal layer which portion is left on the center part of the insulating layer 20, is used for a power-supplying or grounding purpose. The left portion 31 of the metal layer is connected to some bond pads 11 which are also used for a power supplying or grounding purpose. On the other hand, FIG. 7 is a cross-sectional view taken along the line VII—VII of FIG. 6, illustrating the metal traces 30 which are connected to bond pads 11 used for an electrical signaling purpose. FIG. 8 is a cross-sectional view taken along the line VIII—VIII of FIG. 6, illustrating the left portion 31 of the metal layer which portion is connected to bond pads 11 used for a power supplying or grounding purpose.

In the meanwhile, it is preferred that the metal trace 30 be constructed not to have a single-layered contour but to have a three-layered contour of Al/Ni/Au. Aluminum (Al) is brought into direct contact with aluminum which is a material of the bond pad 11, and nickel (Ni) serves as a diffusion-preventing layer which prevents aluminum and gold from reacting with each other. Gold (Au) is rapidly diffused in a subsequent process, thereby ensuring a reliable bonding. On the other hand, it is preferred that the aluminum, nickel and gold be deposited to thicknesses of 5,000 Å, 2,000 Å and 5,000 Å, respectively, and specifically, an entire thickness of the metal trace 30 be controlled to 10,000~20,000 Å. Also, instead of the above-described materials and the three-layered contour, the metal trace 30 can be selected from a group consisting of Al/Ni/Au, Al/Pd/Au, Al/Pt/Au, Al/Cu/Ni/Cr/Au, Al/Cu/Ni/Co/Au, Al/Ni/Au/Sn, Al/Ni/Cr/Au/Sn, and Al/Co/Au/Sn.

Thereupon, the wafer 10 is cut along a scribe line, whereby the wafer 10 is divided into respective semiconductor chips such as two 40 and 41. Next, a process for bonding two semiconductor chips 40 and 41 is executed. The bonding process can be executed in two different methods.

Figure 9:
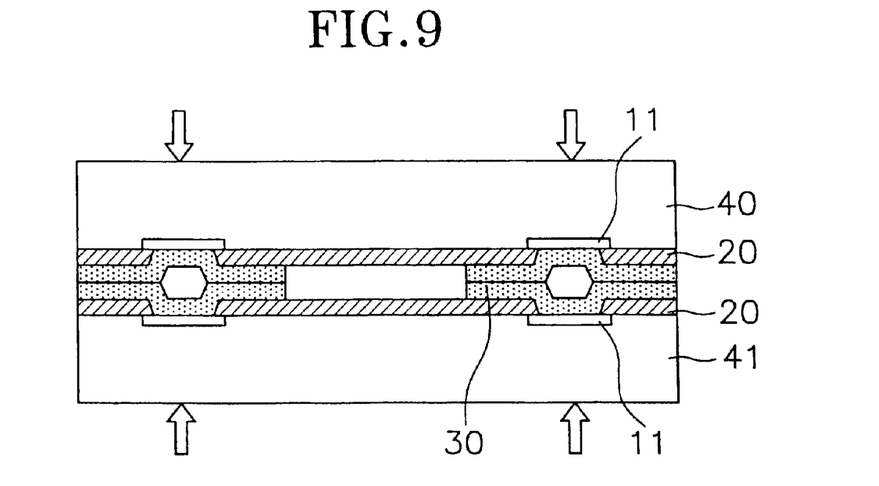
Figure 10:
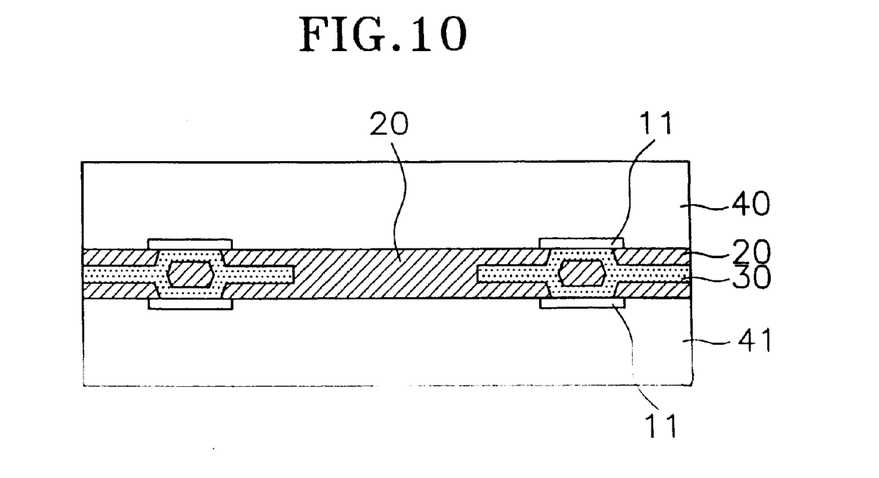
Figure 11:
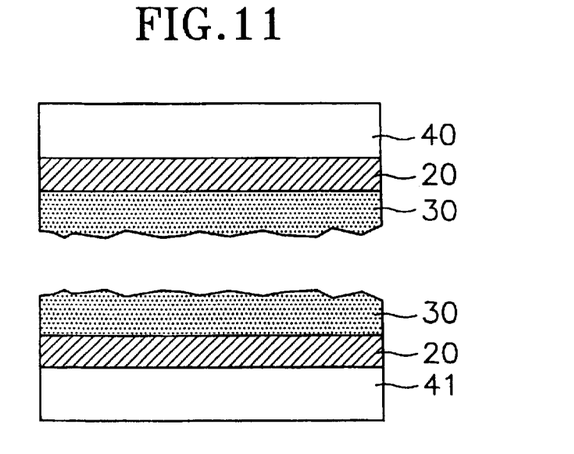
Figure 12:
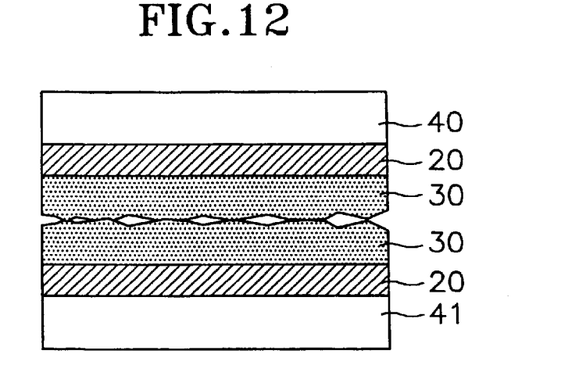
Figure 13:
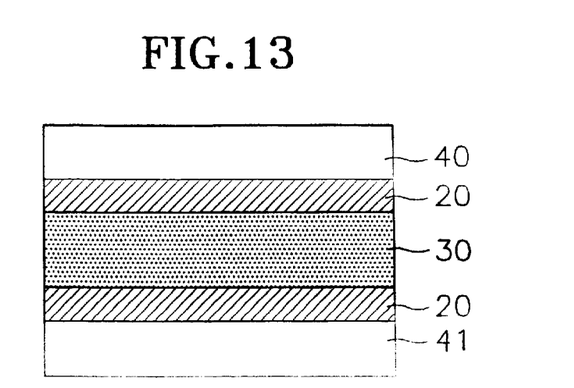
Figure 14:
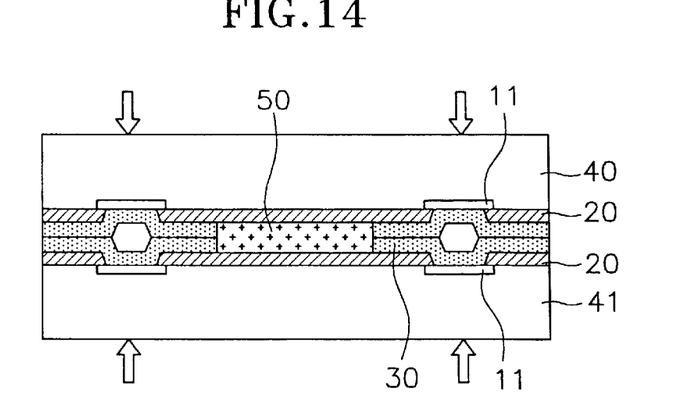

In a first method, as shown in FIG. 11, surfaces of the metal traces 30 of the respective semiconductor chips 40 and 41 are cleaned using a plasma. By this, the surfaces of the metal traces 30 which are made from gold, are activated. Then, the insulating layers 20 are soft cured. In this state, as shown in FIG. 9, the upper semiconductor chip 40 is turned over and is laid on the lower semiconductor chip 41. Thereafter, by implementing a thermal compressing process, the activated surfaces of the metal traces 30 undertake to be bonded as shown in FIG. 12. Finally, two metal traces 30 are fully bonded to each other. Of course, as shown in FIG. 10, the insulating layers 20 are also bonded to each other. Following this, the entire resultant structure is hard cured, to firm a bonding boundary surface. It is preferred that a thermal compressing temperature be 300° C.

Figure 15:
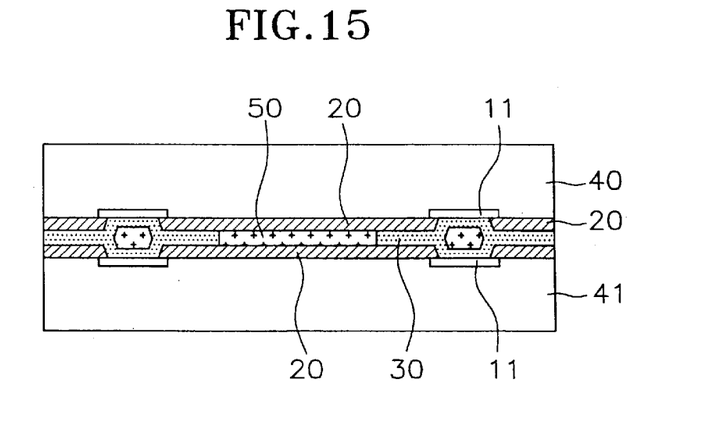
Figure 16:
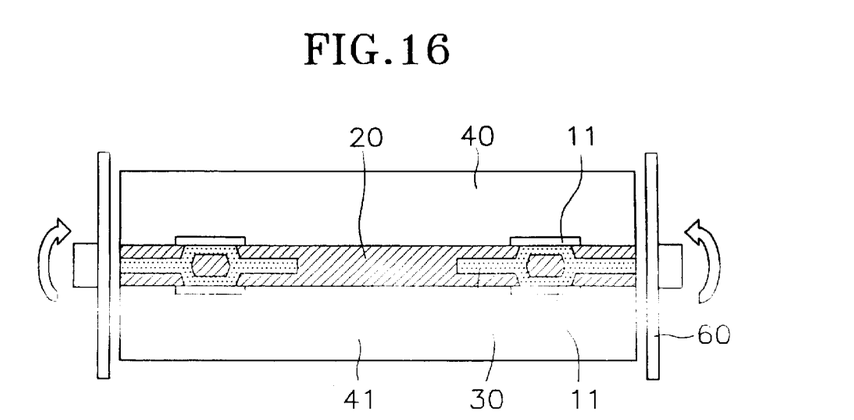

A second method is used in the case that the insulating layers 20 cannot be soft cured. In this second method, after an adhesive 50 is applied between the insulating layers 20, by implementing a thermal compressing process, bubbles in the adhesive 50 are removed and the metal traces 30 are bonded to each other. After that, by curing the entire resultant structure, the upper and lower semiconductor chips 40 and 41 are bonded to each other by the medium of the adhesive 50 as shown in FIG. 15.

Figure 17:
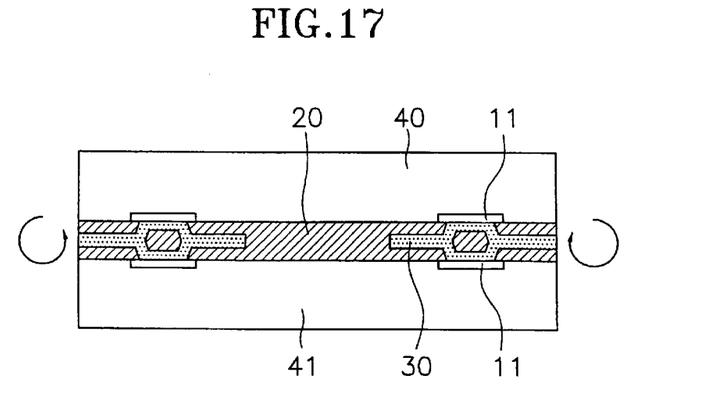
Figure 18:
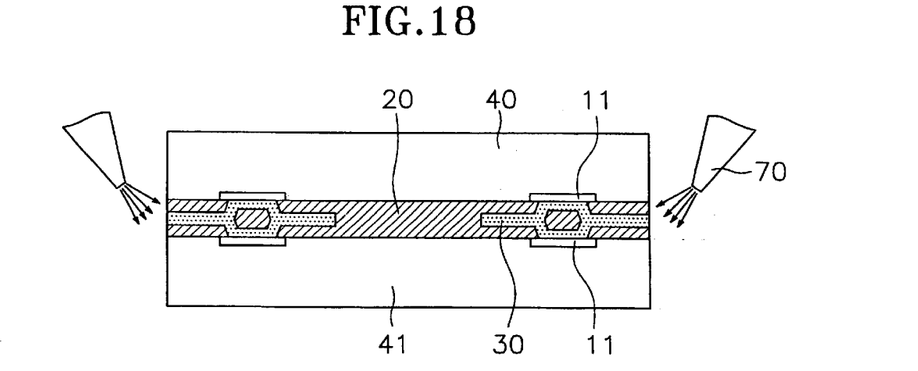

On the assumption that the first method is used, both sides of the respective semiconductor chips 40 and 41 which are stacked one up the other, are grounded using a grounding tool 60, whereby the metal traces 30 are exposed from the insulating layers 20. Then, as shown in FIG. 17, the exposed portions of the metal traces 30 are finely etched, and thereby foreign substances which exist on the exposed portions of the metal traces 30, are removed. Otherwise, as shown in FIG. 18, in place of the grounding tool 60, a grounding operation can be performed in a manner such that a grounding agent is injected through a nozzle 70 onto both sides of the respective semiconductor chips 40 and 41.

Figure 19:
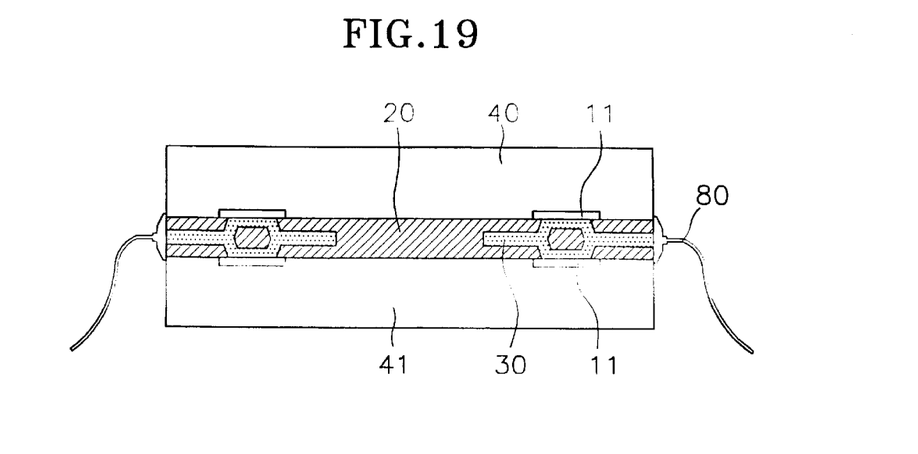
Figure 20:
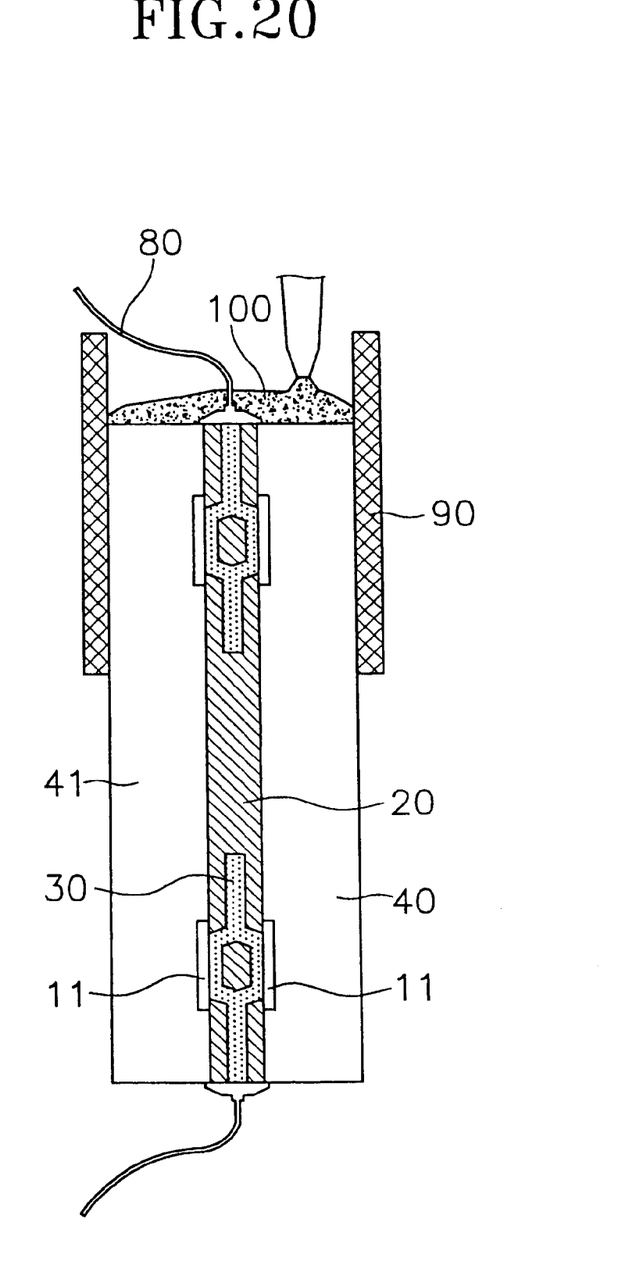
Figure 21:
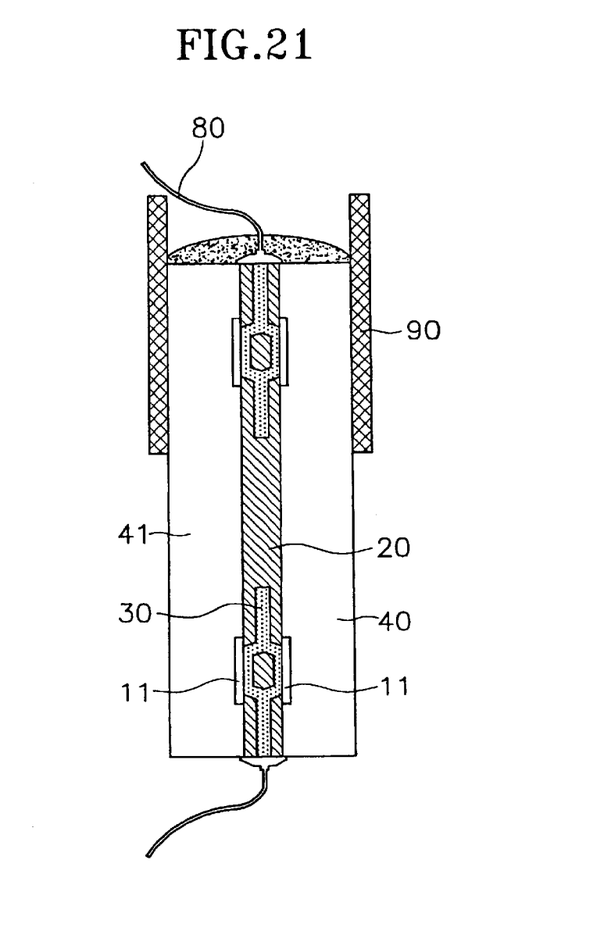
Figure 22:
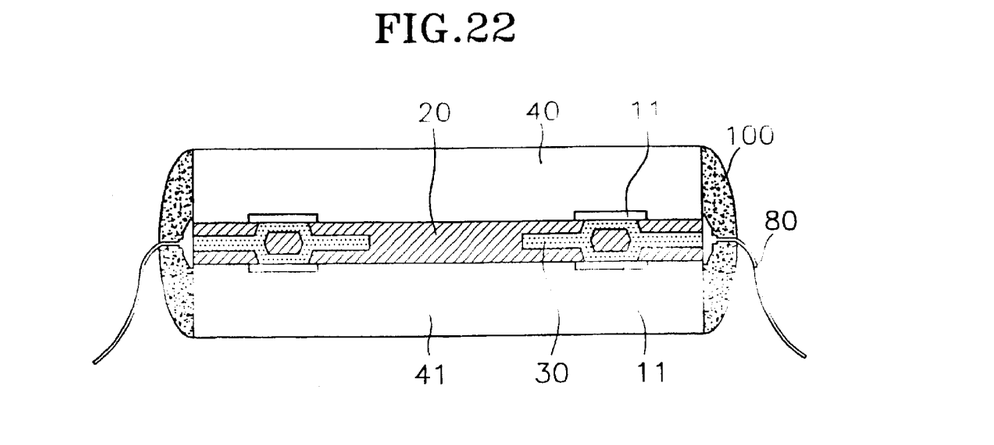

Following this, as shown in FIG. 19, one ends of metal wires 80 which serve as outside connection terminals, are bonded to the exposed portions of the metal traces 30. Then, as can be readily seen from FIG. 20, after the entire resultant structure is erected, in a state wherein jigs 90 are brought into contact with surfaces of the upper and lower semiconductor chips 40 and 41, respectively, an encapsulate 100 is applied into between the upper and lower semiconductor chips 40 and 41. Finally, as shown in FIG. 22, by removing the jigs 90, the encapsulate 100 remains molding only both sides of the semiconductor chips 40 and 41 which are stacked one up the other and bonded to each other. As a consequence, an upper surface of the upper semiconductor chip 40 and a lower surface of the lower semiconductor chip 41 remain exposed. At this time, the other ends of the metal wires 80 are exposed out of the encapsulate 100 to be mounted to a board.

Embodiment 2

Figure 23:
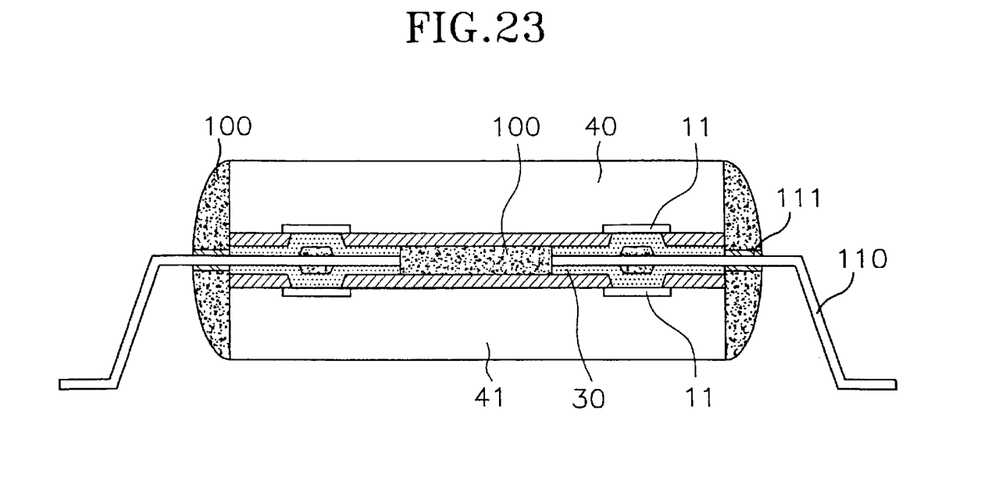
FIG. 23 is a cross-sectional view illustrating a chip size stack package in accordance with a second embodiment of the present invention.
Figure 24:
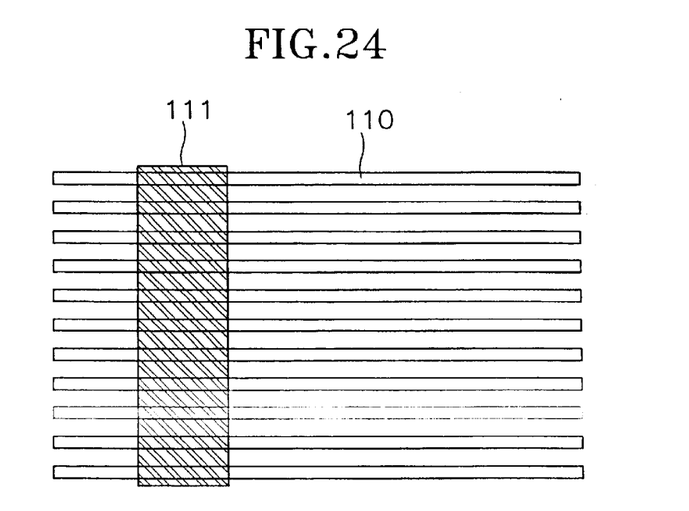
FIG. 24 is a plan view illustrating a pattern tape used in the second embodiment of the present invention.

FIG. 23 is a cross-sectional view illustrating a chip size stack package in accordance with a second embodiment of the present invention; and FIG. 24 is a plan view illustrating a pattern tape used in the second embodiment of the present invention.

Pattern tapes 110 which are used as the outside connection terminals, have a configuration in which metal patterns are arranged in an insulating layer, as well known in the art. Because the pattern tapes 110 which are configured in this way, cannot be bonded with the metal wires 80 as used in the first embodiment, another method is adopted.

First of all, as shown in FIG. 24, respective metal patterns of the pattern tapes 110 are held connected one with another by a connection tape. After one ends of the pattern tapes 110 which have the above-described configuration, are located between the metal traces 30 as shown in FIG. 23, by implementing a thermal compressing process, the metal traces 30 and the metal patterns of the pattern tapes 110 are electrically connected with each other. In order to facilitate an electrical connection with the metal traces 30, it is preferred that the metal patterns of the pattern tapes 110 be plated with gold.

Meanwhile, when the thermal compressing process is implemented, a space is created between the insulating layers 20. In this state, by molding the space created between the insulating layers 20 and both sides of the upper and lower semiconductor chips 40 and 41 using an encapsulate 100, only the other ends of the pattern tapes 110 are exposed.

In the method according to this second embodiment of the present invention, since metal wires are not used, a wire bonding process can be omitted, and the pattern tapes 110 serving as the outside connection terminals can be bonded to the metal traces 30 at the same time when the respective semiconductor chips 40 and 41 are bonded to each other.

Embodiment 3

Figure 25:
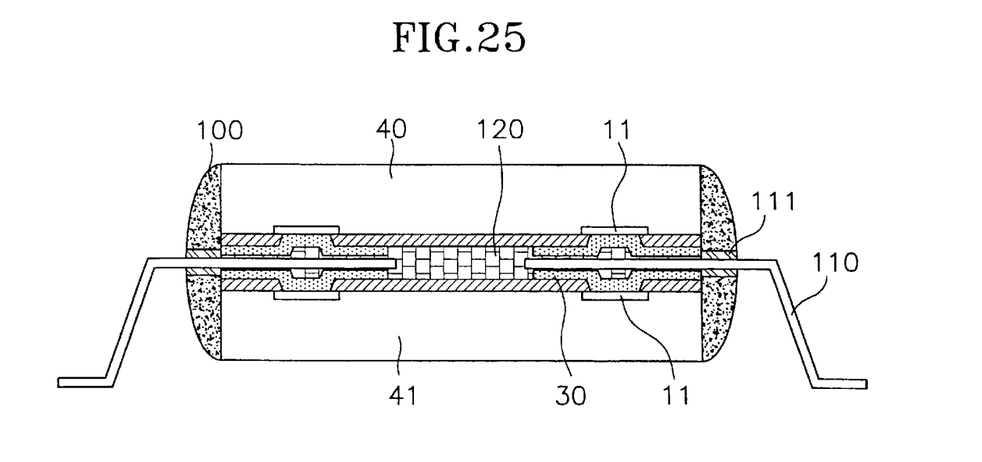
FIG. 25 is a cross-sectional view illustrating a chip size stack package in accordance with a third embodiment of the present invention.

FIG. 25 is a cross-sectional view illustrating a chip size stack package in accordance with a third embodiment of the present invention. As shown in FIG. 25, this embodiment is similar to the second embodiment in that pattern tapes 110 are used and is different from the second embodiment in that an anisotrophic conductive adhesive (ACA) 120 is filled between the two semiconductor chips 40 and 41 when the two semiconductor chips 40 and 41 are bonded to each other.

Namely, the ACA 120 is filled between the insulating layers 20, and one ends of the pattern tapes 110 are intervened between the metal traces 30. In this state, by curing the entire resultant structure, the metal patterns of the pattern tapes 110 are electrically connected to the metal traces 30 through the ACA 120 which is made from a conductive material. In this way, advantages are provided in that the semiconductor chips 40 and 41 can be mechanically bonded to each other and at the same time, can be electrically connected with each other, through a single process.

Embodiment 4

Figure 26:
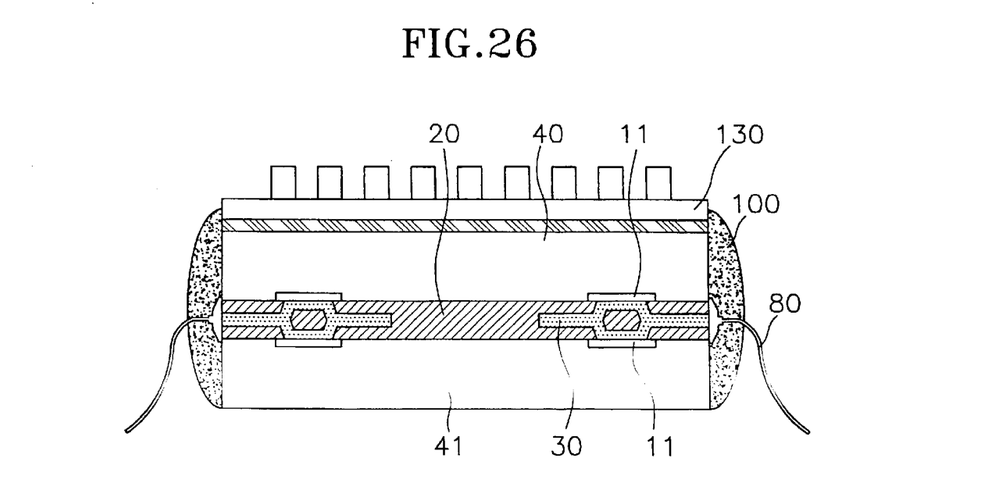
FIG. 26 is a cross-sectional view illustrating a chip size stack package in accordance with a fourth embodiment of the present invention.

FIG. 26 is a cross-sectional view illustrating a chip size stack package in accordance with a fourth embodiment of the present invention. As shown in FIG. 26, this embodiment is constructed in the same manner as the first embodiment, except that a heat sink 130 which has a prominence and depression on an upper surface thereof, is attached to the upper surface of the upper semiconductor chip 40. Of course, also in the second and third embodiments, because the upper surface of the upper semiconductor chip 40 is held exposed, a heat sink 130 can be attached thereto.

As described above, according to the present invention, advantages are provided in that, since bond pads of upper and lower semiconductor chips which are stacked one up the other, are directly connected to outside connection terminals by the medium of metal traces, electrical signal paths are shortened. Also, by the fact that the metal traces are used, signal interference can be minimized.

Further, because lead frames are not used, it is possible to stack the semiconductor chips using a simple thermal compressing procedure without requiring costly laser equipment.

Also, because an encapsulate molds only sides of stacked semiconductor chips, when a flaw is induced in only one semiconductor chip, by removing the encapsulate at the sides, the only one semiconductor chip having the flaw can be discarded.

Moreover, due to the fact that a surface of each of the semiconductor chips is exposed, a heat dissipation characteristic is improved and a heat sink can be attached to the exposed surface.

In addition, since the sides of the respective semiconductor chips are molded by the encapsulate, it is possible to prevent moisture from leaking into the stack package.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a chip size stack package, the method comprising:

applying an insulating layer to a surface of a wafer which has a plurality of semiconductor chips, etching the insulating layer and thereby exposing bond pads of each semiconductor chip;

depositing, a metal layer on the insulating layer, patterning the metal layer and thereby forming metal traces, the metal traces having one end which is connected to the exposed bond pads and other ends which extend toward edges of respective semiconductor chips;

cutting the wafer along a scribe line, thereby dividing the wafer into the respective semiconductor chips, and exposing the other ends of the metal traces at sides of the insulating layer;

coupling upper and lower semiconductor chips to each other by directly coupling the metal traces to each other, which are cut from the wafer and thereby electrically connecting the metal traces with each other;

bonding one end of metal wires to the exposed other ends of the metal traces; and molding both sides of the upper and lower semiconductor chips which are coupled to each other, using an encapsulate, in a manner such that the other ends of the metal wires and semiconductor chips are exposed.

2. The method as claimed in claim 1, wherein the coupling step comprises:

soft curing insulating layers of the upper and lower semiconductor chips;

thermally compressing the insulating layers and the metal traces; and hard curing the insulating layers.

3. The method as claimed in claim 2, wherein, before the compressing step, the coupling step further comprises:

cleaning the metal traces using a plasma thereby to activate the metal traces.

4. The method as claimed in claim 1, wherein the coupling step comprises:

bonding insulating layers of the and lower semiconductor chips, by the medium of an adhesive; and curing the insulating layers and the adhesive.

5. The method as claimed in claim 1, further comprising:

grinding sides of the respective semiconductor chips after the wafer is divided into the respective semiconductor.

6. The method as claimed in claim 5, wherein, after the sides of the respective semiconductor chips are ground, the method further comprises:

performing a fine etching process for removing foreign substances which exist on the other ends of the metal traces which are exposed at the sides of the insulating layers.

7. The method as claimed in claim 1, wherein, after the sides of the respective semiconductor chips are ground, the method further comprises:

attaching a heat sink to a surface of the upper semiconductor chip.

* * * * *

UNITED STATES PATENT AND TRADEMARK OFFICE
CERTIFICATE OF CORRECTION

| | |
|---|---|
| PATENT NO. | : 6,589,813 B1 |
| APPLICATION NO. | : 09/604089 |
| DATED | : July 8, 2003 |
| INVENTOR(S) | : Sang Wook Park |

It is certified that error appears in the above-identified patent and that said Letters Patent is hereby corrected as shown below:

Title page, item (*) Notice: Delete "This patent is subject to a terminal disclaimer"

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,589,813 B1 | Page 1 of 1 |
| APPLICATION NO. | : 09/604089 | |
| DATED | : July 8, 2003 | |
| INVENTOR(S) | : Sang Wook Park | |

It is certified that error appears in the above-identified patent and that said Letters Patent is hereby corrected as shown below:

This certificate supersedes Certificate of Correction issued August 29, 2006, should be vacated since no Certificate of Correction was granted for this patent number.

Signed and Sealed this

Twenty-eighth Day of November, 2006

JON W. DUDAS
*Director of the United States Patent and Trademark Office*